US006577193B2

(12) United States Patent
Kim

(10) Patent No.: US 6,577,193 B2

(45) Date of Patent: Jun. 10, 2003

(54) LINEAR POWER AMPLIFYING APPARATUS

(75) Inventor: Dae-Weon Kim, Kyungki-Do (KR)

(73) Assignee: LG Electronics Inc., Seoul (KR)

( * ) Notice: Subject to any disclaimer, the term of this patent is extended or adjusted under 35 U.S.C. 154(b) by 111 days.

(21) Appl. No.: 09/801,638

(22) Filed: Mar. 9, 2001

(65) Prior Publication Data

US 2001/0020868 A1 Sep. 13, 2001

(30) Foreign Application Priority Data

Mar. 9, 2000 (KR) ........................................ 2000-11817

(51) Int. Cl.[7] .................................................. H03F 1/26

(52) U.S. Cl. ........................................ 330/151; 330/149

(58) Field of Search .................................. 330/149, 151

(56) References Cited

U.S. PATENT DOCUMENTS 5,489,875 A * 2/1996 Cavers ....................... 330/151
6,091,297 A * 7/2000 Bar-David et al. .......... 330/149

* cited by examiner

*Primary Examiner*—Robert Pascal
*Assistant Examiner*—Khanh Van Nguyen
(74) *Attorney, Agent, or Firm*—Fleshner & Kim, LLP

(57) ABSTRACT

A linear power amplifying apparatus is disclosed. In case where the phases of the signal amplified in the main amplifier and of the input signal are compared, the amplified signal and the input signal are distributed and then coupled with a predetermined phase difference, thereby reducing the error component and widening the tolerance band which can attenuate the carrier as much as desired, so that the phase controlling for carrier attenuation is facilitated. In addition, in case where the phase of the error signal amplified in the error amplifier and that of the input signal amplified in the main amplifier are compared, the error signal and the input signal are distributed and then coupled with a predetermined phase difference, thereby reducing the error component and widening the tolerance band which can attenuate the error as much as desired, so that the phase controlling for error attenuation is facilitated. Consequently, as the carrier cancellation and error cancellation are facilitated, the harmonics produced when the main amplifier amplifies the input signal is easily removed.

25 Claims, 5 Drawing Sheets

INPUT
OUTPUT
41
42
43
44
MAIN AMP
45
46
47
48
49
ERROR AMP
50
100
CARRIER CANCELLATION LOOP CIRCUIT
200
ERROR CANCELLATION LOOP CIRCUIT
CONTROL
CONTROL
CONTROL
CONTROL

LINEAR POWER AMPLIFYING APPARATUS

BACKGROUND OF THE INVENTION

1. Field of the Invention

The present invention relates to a linear power amplifying apparatus, and more particularly, to a linear power amplifying apparatus in base station for a mobile communication.

2. Description of the Background Art

Generally, a radio frequency band amplifier using active elements creates undesired distorted components according to power level variation. Especially, when an amplifier is operated in the vicinity of a saturation area, a non-linear phenomenon remarkably occurs, distorting an amplitude and a phase of an output. In case that more than two signals are inputted, inter-modulation distortion (IMD) components are generated between the inputted signals, having a big influence on an adjacent channel. Such IMD components work as a noise source, degrading a transfer quality of a communication system.

Accordingly, in case of an amplifier in use for a radio frequency transmission terminal of the base station for mobile communication, an operating point of the amplifier is positioned at a few decibel (dB) back-off position from the saturation area, so that the amplifier can be operated at the linear area.

In this case, however, since the input level of the amplifier needs to be low, so that its output level becomes too low.

In an effort to solve the problem, a research has been conducted for a method to add a linear circuit which minimizes an IMD component among outputs of the amplifier, to the amplifier. This method is advantageous in that even though the amplifier is operated in the non-linear area in the vicinity of the saturation area, an output signal of a desired amplitude having less IMD component is obtained.

FIG. 1 is a schematic block diagram of a linear power amplifying apparatus including a linear circuit in accordance with a conventional art.

As shown in the drawing, a linear power amplifying apparatus includes a pre-amplifier 1, a first distributor 2, a main amplification circuit 6, a second distributor 7, a second delay unit 8, a second coupler 9, a first delay unit 10, a first coupler 11 and an error amplification circuit 15.

The pre-amplifier 1 amplifies an infinitesimal input signal to a predetermined amplitude with which main amplification circuit 6 is operable. The first distributor 2 distributes the output signal of the pre-amplifier 1.

The main amplification circuit 6 amplifies one signal distributed by the first distributor 2 to an amplitude suitable to a mobile communication radio interface. The second distributor 7 distributes the amplified signal outputted from the main amplification circuit 6.

The first delay unit 10 delays the other signal distributed by the first distributor 2 as long as the time taken for one signal to pass the main amplification circuit 6. The first coupler 11 couples one signal distributed by the second distributor 7 and the other signal delayed by the first delay unit 10.

The error amplification circuit 15 amplifies an error signal outputted from the first coupler 11 as large as the amplification of the main amplification circuit 6. The second delay unit 8 delays the other signal distributed by the second distributor 7 as long as the time taken for one signal to pass the error amplification circuit 15.

The second coupler 9 couples the signal delayed by the second delay unit 8 and the signal outputted from the error amplification circuit 15 and outputs it.

The main amplification circuit 6 and the error amplification circuit 15 includes variable attenuators 3 and 12 for variably attenuating an inputted signal, variable phase shifters 4 and 13 for varying a phase of a signal outputted from the variable attenuators 3 and 12, and a main amplifier 5 and an error amplifier 14 each for amplifying the signal outputted from the variable phase shifters 4 and 13 to a predetermined amplitude, respectively.

The operation of the conventional linear power amplifying apparatus constructed as described will now be explained.

First, when an infinitesimal input signal is inputted, the pre-amplifier 1 amplifies the input signal to a predetermined amplitude with which the main amplification circuit 6 is operable.

The first distributor 2 distributes the output signal of the pre-amplifier 1 and outputs one signal to the main amplification circuit 6 and the other signal to the first delay unit 10.

The signal outputted to the main amplification circuit 6 passes the variable attenuator 3, the variable phase shifter 4 and the main amplifier 5, and then is amplified to an amplitude suitable to the mobile communication radio interface. At this time, a large amount of harmonics are generated.

The second distributor 7 distributes the output signal including the harmonics component from the main amplification circuit 6, and outputs one signal to the second delay unit 8 and the other signal to the first coupler 11.

Meanwhile, the first delay unit 10 the signal distributed by the first distributor 2 as long as the passing time of the main amplification circuit 6 and outputs it to the first coupler 11.

The first coupler 11 couples the signal including the harmonic component distributed by the second distributor 7 and the signal delayed by the first delay unit 10 and outputs a carrier-cancelled error signal.

The error amplification circuit 15 amplifies the error signal outputted from the first coupler 11, passing through the variable attenuator 12, the variable phase shifter 13 and the error amplifier 14, and amplifies the amplitude of amplification of the main amplification circuit 6. At this time, the error amplifier 14 amplifies only the amplitude without generating harmonics.

The second delay unit 8 delays the signal including the harmonics outputted from the second distributor 7 as long as the passing time of the error amplification circuit 15 and outputs it to the second coupler 9.

The second coupler 9 couples the carrier signal including the harmonics received from the second delay unit 8 and the error signal of which only the harmonics has been amplified received from the error amplification circuit.

At this time, the carrier signal including the harmonics and the error signal of which only the harmonics has been amplified have the same amplitude to each other and are adjusted to have a phase difference of 180°. Thus, when the two signals are coupled by the second coupler 9, the high frequency component are mutually canceled, so that an amplified carrier signal having an amplitude suitable to the mobile communication radio interface, which is similar to the original input signal, is outputted.

However, the conventional linear power amplifying apparatus has a problem that the variable attenuator which variably attenuates the amplitude of the input signal and the variable phase shifter which variably shifts the phase of the input signal are not accurately controlled, resulting in that it is difficult to obtain a signal having the opposite phase, and thus, the harmonic component cancellation effect is degraded.

SUMMARY OF THE INVENTION

Therefore, an object of the present invention is to provide a linear power amplifying apparatus suitable to cancellation of harmonics in a mobile communication.

To achieve these and other advantages and in accordance with the purpose of the present invention, as embodied and broadly described herein, there is provided a linear power amplifying apparatus including: a first distributor for distributing an input signal; a variable attenuator for receiving one signal distributed by the first distributor and variably attenuating the amplitude of the signal according to an amplitude control signal; a variable phase shifter for shifting a phase of the signal outputted from the variable attenuator according to a phase control signal; a main amplifier for amplifying the signal shifted by the variable phase shifter to a predetermined level; a second distributor for distributing the signal outputted from the main amplifier; a delay unit for delaying the other signal distributed by the first distributor for a predetermined time and outputting it; and a carrier cancellation loop circuit for comparing the amplitude and phase of the output signal of the delay unit and those of the output signal of the second distributor, and generating the amplitude control signal for compensating an amplitude difference and a phase control signal for compensating the phase difference between the two output signals, respectively.

In order to achieve the above objects, there is also provided a linear power amplifying apparatus including: a first distributor for distributing the input signal; a first variable attenuator for receiving one of signals distributed by the first distributor and variably attenuating the amplitude of the signal according to a first amplitude control signal; a first variable phase shifter for shifting the phase of the signal outputted from the first variable attenuator according to a first phase control signal; a main amplifier for amplifying the signal shifted by the variable phase shifter to a predetermined level; a second distributor for distributing the signal outputted from the main amplifier; a first delay unit for delaying the other signal distributed by the first distributor for a predetermined time and outputting it; a carrier cancellation loop circuit for comparing the amplitude and phase of the output signal of the first delay unit and those of one output signal distributed by the second distributor, and generating the first amplitude control signal for compensating an amplitude difference and the first phase control signal for compensating a phase difference between the two output signals, respectively; a second variable attenuator for receiving an error signal from the carrier cancellation loop circuit and attenuating the amplitude of the signal according to a second amplitude control signal; a second variable phase shifter for receiving a signal attenuated by the second variable attenuator and shifting the phase of the signal according to a second phase control signal; an error amplifier for amplifying the error signal outputted from the second variable phase shifter without harmonics; a second delay unit for delaying the other output signal of the second distributor for a predetermined time and outputting it; and an error cancellation loop circuit for comparing the amplitude and the phase of the output signal of the second delay unit and those of the error signal outputted from the error amplifier, and generating the second amplitude control signal for compensating an amplitude difference and the second phase control signal for compensating a phase difference between the output signal of the second delay unit and the error signal, respectively.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 2:
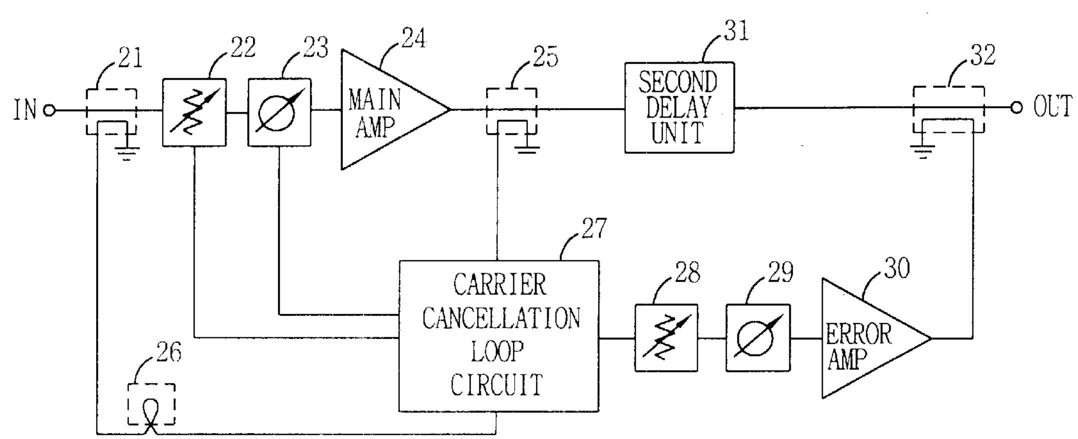
FIG. 2 is a schematic block diagram of a linear power amplifying apparatus in accordance with one embodiment of the present invention.

FIG. 2 is a schematic block diagram of a linear power amplifying apparatus in accordance with one embodiment of the present invention.

As shown in the drawing, the linear power amplifying apparatus includes an input signal distributor 21, a first variable attenuator 22, a first variable phase shifter 23, a main amplifier 24, an amplified signal distributor 25, a first delay unit 26, a carrier cancellation loop circuit 27, a second variable attenuator 28, a second variable phase shifter 29, an error amplifier 30, a second delay 31 and a coupler 32.

The input signal distributor 21 distributes an input signal.

The first variable attenuator 22 attenuates one signal as distributed according to an amplitude control signal generated from the carrier cancellation loop circuit 27.

The first variable phase shifter 23 shifts the phase of the signal outputted from the first variable attenuator 22 according to the phase control signal generated from the carrier cancellation loop circuit 27.

The main amplifier 24 amplifies the signal outputted from the first variable phase shifter 23 to have an amplitude suitable to a mobile communication radio interface.

The amplified signal distributor 25 distributes the signal amplified by the main amplifier 24 to the carrier cancellation loop circuit 27 and the second delay unit 31.

The first delay unit 26 delays the other signal distributed by the input signal distributor 21 through a transmission line for as long as time the time taken for one signal distributed by the input signal distributor 21 to pass the first variable attenuator 22, the first variable phase shifter 23 and the main amplifier 24.

The carrier cancellation loop circuit 27 distributes one signal distributed from the amplified signal distributor 25 and the signal delayed by the first delay unit 26, respectively, creates a predetermined phase difference between the two signals by transmitting the two signals through the transmission lines having different length, couples the two signals, compares the phases of the coupled signals, controls the phase shift of the signal received from the input signal distributor 21 according to the comparison, couples the amplified signal distributed by the amplified signal distributor 25 and the input signal received from the first delay 26, cancels a carrier, and outputs the error signal to the second variable attenuator 28.

Figure 4:
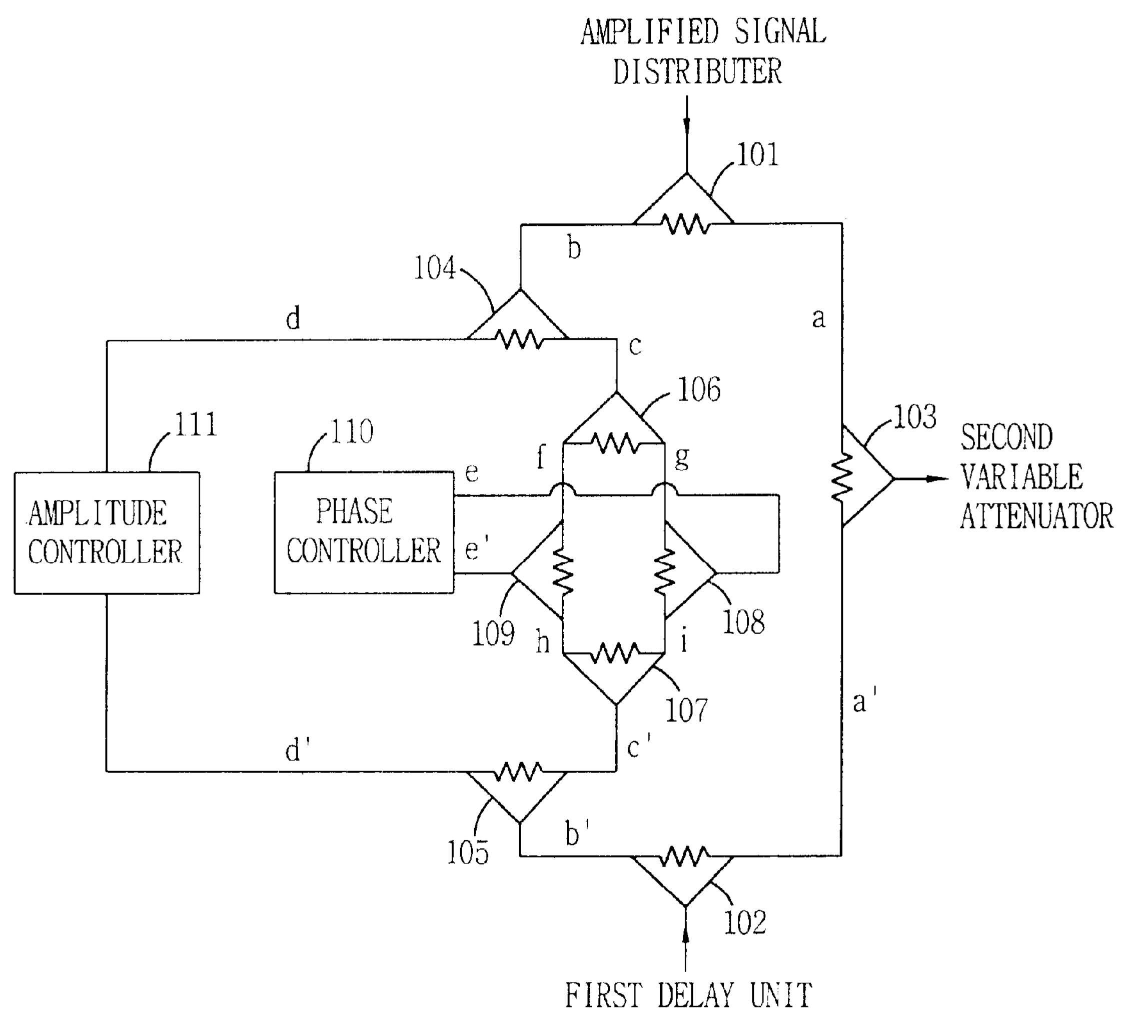
FIG. 4 is a view illustrating a construction of a carrier cancellation loop circuit in accordance with the present invention.

As shown in FIG. 4, the carrier cancellation loop circuit 27 a first distributor 101, a second distributor 102, a first coupler 103, a third distributor 104, a fourth distributor 105, a fifth distributor 106, a sixth distributor 107, a second coupler 108, a third coupler 109, a phase controller 110 and an amplitude controller 111.

The first distributor 101 distributes the amplified signal outputted from the amplified signal distributor 25.

The second distributor 102 distributes the signal outputted from the first delay 26.

The first coupler 103 couples the first signal distributed by the first distributor 101 and the first signal distributed by the second distributor 102 and cancels a carrier.

The third distributor 104 distributes the second signal distributed by the first distributor 101.

The fourth distributor 105 distributes the second signal distributed by the second distributor 102.

The fifth distributor 106 distributes the first signal distributed by the third distributor 104.

The sixth distributor 107 distributes the first signal distributed by the fourth distributor 105.

The second coupler 108 receives the first signal distributed by the fifth distributor 106 and the first signal distributed by the sixth distributor 107 with a predetermined phase difference and couples them.

The third coupler 109 receives the second signal distributed by the fifth distributor 106 and the second signal distributed by the sixth distributor 107 with a predetermined phase difference and couples them.

The phase controller 110 compares the phase of output signal of the second coupler 108 and that of the output signal of the third coupler 109 and outputs the phase control signal for correcting the phase difference between the two signals to the first variable phase shifter 23.

The amplitude controller 111 compares the amplitude of the second signal distributed by the third distributor 104 and that of the second signal distributed by the fourth distributor 105, and outputs the amplitude control signal for correcting the amplitude difference between the two signals to the first variable attenuator 22.

The length of the transmission line ‘a’ between the first distributor 101 and the first coupler 103 is equal to the length of the transmission line ‘a’ between the second distributor 102 and the first coupler 103. Likewise, the length of the transmission line ‘b’ is equal to the length of ‘b’, the length of the transmission line ‘c’ is equal to the length of ‘c’, the length of the transmission line ‘d’ is equal to the length of ‘d’, and the length of the transmission line ‘e’ is equal to the length of 'e".

However, it is constructed that the length of the transmission line ‘f’ between the fifth distributor 106 and the third coupler 109 and the length of the transmission line ‘h’ between the sixth distributor 107 and the third coupler 109 is not equal.

That is, the length of ‘f’ and the length ‘h’ are constructed to be different so as to have a predetermined phase difference value between a signal passing the transmission line ‘f’ and a signal passing the transmission line ‘h’.

In the same manner, the length of ‘g’ and the length of ‘i’ are constructed to be different so as to have a predetermined phase difference value between a signal passing the transmission line ‘g’ and the transmission line ‘i’.

In this respect, the length of ‘f’ and the length of ‘i’ may be implemented to be the same, and the length of ‘g’ and the length of ‘h’ may be implemented to be the same, too.

Figure 1:
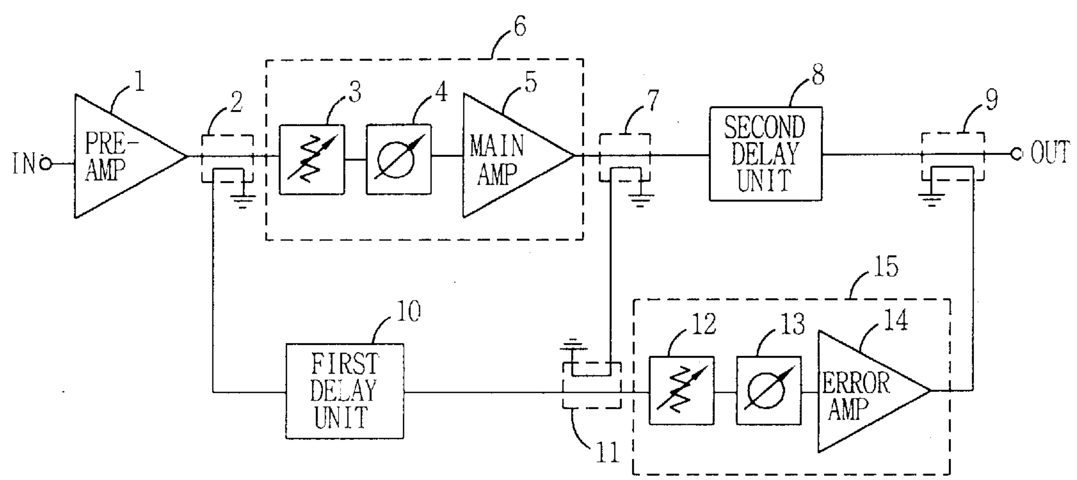
FIG. 1 is a schematic block diagram of a linear power amplifying apparatus in accordance with a conventional art.

With reference to FIG. 2, the second variable attenuator 28 attenuates the carrier-cancelled error signal as outputted from the carrier cancellation loop circuit 27. The second variable phase shifter 29, the error amplifier 30, the second delay 31 and the coupler 32 are operated in the same manner as in the conventional linear amplifying apparatus of FIG. 1, of which descriptions are thus omitted.

The operation of the linear power amplifying apparatus constructed as described above in accordance with one embodiment of the present invention will now be explained.

A signal inputted to the linear power amplifying apparatus is amplified in a pre-amplifier (not shown in FIG. 2) to have an amplitude suitable to be operable in the main amplifier, and then inputted to the input signal distributor 21. Then, the input signal distributor 21 distributes the input signal to the first variable attenuator 22 and the first delay unit 26.

The first variable attenuator 22 attenuates one signal as distributed by the input signal distributor 21 according to the amplitude controlling by the carrier cancellation loop circuit 27.

The first variable phase shifter 23 shifts the phase of the signal outputted from the first variable attenuator 22 according to the phase controlling by the carrier cancellation loop circuit 27.

The main amplifier 24 amplifies the signal outputted from the first variable phase shifter 23 to an amplitude suitable to the mobile communication radio interface. Since the mobile communication radio interface needs a great signal power, the amplified signal includes a large amount of harmonics.

The amplified signal having harmonics is distributed to the carrier cancellation loop circuit 27 and the second delay 30 by the amplified signal distributor 25. In this respect, about 1/10000 (−40 dB) of the amplified signal is distributed to the carrier cancellation loop circuit 27 and the remaining amplified signal is mostly distributed to the second delay unit 31.

Meanwhile, the first delay unit 26 delays the input signal as distributed in the input signal distributor for a predetermined time and transmits it to the carrier cancellation loop circuit 27.

The carrier cancellation loop circuit 27 receives the amplified signal distributed from the amplified signal distributor 25 and the input signal delayed in the first delay unit 26.

The inputted amplified signal is distributed to the first distributor 101 and outputted through the transmission line ‘a’ to the first coupler 103.

The first signal distributed from the first distributor 101 is a signal having the harmonics component, and the first signal distributed from the second distributor 102 is an input signal. When these two signals are coupled by the first coupler 103, the carrier is mutually cancelled, so that only the harmonic signal is outputted.

Meanwhile, in order to compare the amplitude and the phase between the amplified signal and the input signal, the third distributor 104 distributes the second signal distributed from the first distributor 101, and the fourth distributor 105 distributes the second signal distributed from the second distributor 102.

The fifth distributor 106 distributes the first signal distributed from the third distributor 104, and the sixth distributor 107 distributes the first signal distributed from the fourth distributor 105.

The first signal distributed from the fifth distributor 106 is transmitted through the transmission line 'g' to the second coupler 108, and the second signal distributed from the fifth distributor 106 is transmitted through the transmission line 'f' to the third coupler 109.

At the same time, the first signal distributed from the sixth distributor 107 is transmitted through the transmission line 'i' to the second coupler 108, and the second signal distributed from the sixth distributor 107 is transmitted through the transmission line 'h' to the third coupler 109.

In this respect, the length of the transmission line 'g' and the length of the transmission line 'i' are implemented so that the phase difference between the two signals inputted to the second coupler 108 is less than 10°.

In addition, it is constructed that the length of the transmission line 'g' and the length of the transmission line 'h' are equal to each other and the length of the transmission line 'f' and the transmission line 'i' are equal to each other, so that the phase difference between the two signals inputted to the third coupler 109 is less than 10°.

The second coupler 108 and the third coupler 109 couples the signals having phase difference less than 10° and outputs them to the phase controller 110, respectively.

The phase controller 110 compares the phase of the output signal of the second coupler 108 and the phase of the output signal of the third coupler 109 and outputs a phase control signal for compensating the phase difference between the two output signals to the second variable shifter 23.

In this respect, in case that the phase difference between the two signals inputted to the second coupler 108 and the phase difference between the two signals inputted to the third coupler 109 is less than 10°, an tolerance band for canceling a carrier can be widened as desired. Then, the phase controlling by the phase controller 110 is facilitated.

If the transmission lines 'f', 'g', 'h' and 'i' have the same lengths, the phase controller 110 would judge that there is no phase difference between two signals only when the phase difference between the signal from the second coupler 108 and the signal from the third coupler 109 is accurately 180°, and would output a phase control signal in a disable state to the first variable phase shifter 23. This means that phase controlling is not easy.

Meanwhile, the amplitude controller 111 receives the the second signal distributed from the third distributor 104 and the second signal distributed from the fourth distributor 105, compares the amplitude of the two signals, and outputs an amplitude control signal to the first variable attenuator 22 to compensate the amplitude difference between the two signals.

As described above, the carrier cancellation loop circuit 27 couples the amplified signal having the harmonics after being amplified by the main amplifier 24 and the input signal, cancels the carrier and outputs an error signal having only the harmonics to the second variable attenuator 28.

Accordingly, when the carrier is cancelled by using the signal amplified by the main amplifier 24 and the input signal distributed from the input signal distributor 21, the carrier cancellation loop circuit 27 widens the allowable phase band for canceling the carrier between the amplified signal and the input signal, thereby facilitating cancellation of carrier.

The operation of the linear power amplifying apparatus in accordance with another embodiment of the present invention will now be explained.

Figure 3:
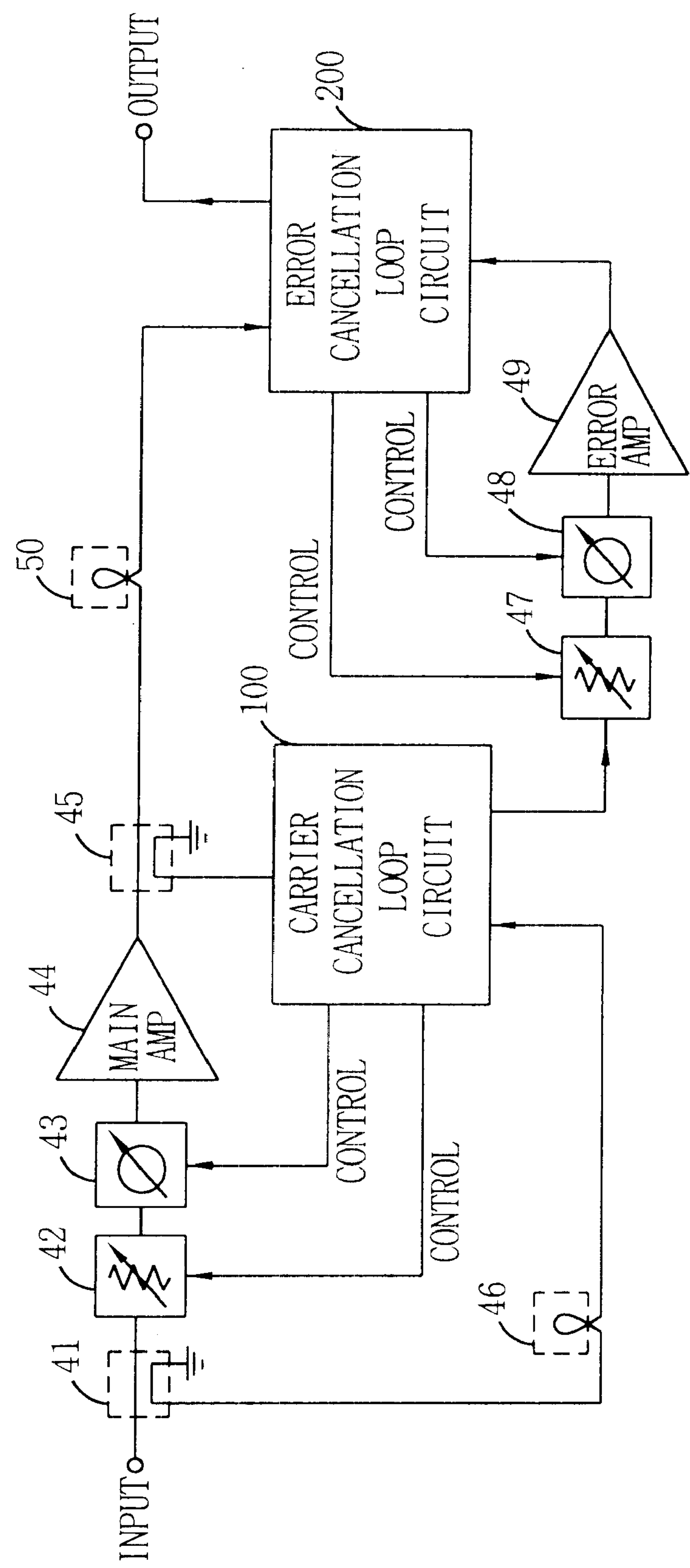
FIG. 3 is a schematic block diagram of a linear power amplifying apparatus in accordance with another embodiment of the present invention.

FIG. 3 is a schematic block diagram of a linear power amplifying apparatus in accordance with another embodiment of the present invention.

As shown in the drawing, the linear power amplifying apparatus includes an input signal distributor 41, a first variable attenuator 42, a first variable phase shifter 43, a main amplifier 44, an amplified signal distributor 45, a first delay unit 46, a second variable attenuator 47, a second variable phase shifter 48, an error amplifier 49, a second delay unit 50, a carrier cancellation loop circuit 100 and an error cancellation loop circuit 200.

The operations of the linear power amplifying apparatus includes an input signal distributor 41, a first variable attenuator 42, a first variable phase shifter 43, a main amplifier 44, an amplified signal distributor 45, a first delay unit 46 and the carrier cancellation loop circuit 100 are the same as those in the first embodiment of the present invention as illustrated in FIG. 2, descriptions of which, thus, are omitted.

The second variable attenuator 47 attenuates the carrier-canceled error signal outputted from the carrier cancellation loop circuit 100 according to the amplitude control signal outputted from the error cancellation loop circuit 200.

The second variable phase shifter 48 shifts the phase of the error signal outputted from the second variable attenuator 47 according to the phase control signal outputted from the error cancellation loop circuit 200.

The error amplifier 49 amplifies the error signal outputted from the second variable phase shifter 48 to an amplification amplitude of the main amplifier 44.

The second delay unit 50 delays the signal distributed in the amplified signal distributor 45 through the transmission line as much as the time until the error signal outputted from the carrier cancellation loop circuit 100 passes the second variable attenuator 47, the second variable phase shifter 48 and the error amplifier 49.

The error cancellation loop circuit 200 distributes the amplified signal as delayed by the second delay unit 50 and the error signal amplified in the error amplifier 49, creates a predetermined phase difference between the two signals, couples them with the phase difference, compares the phases of the coupled signals, controls the phase shift of the error signal according to the comparison, couples the error signal amplified by the error amplifier 49 and the amplified signal delayed by the second delay unit 50, cancels an error, and outputs only the carrier signal.

Figure 5:
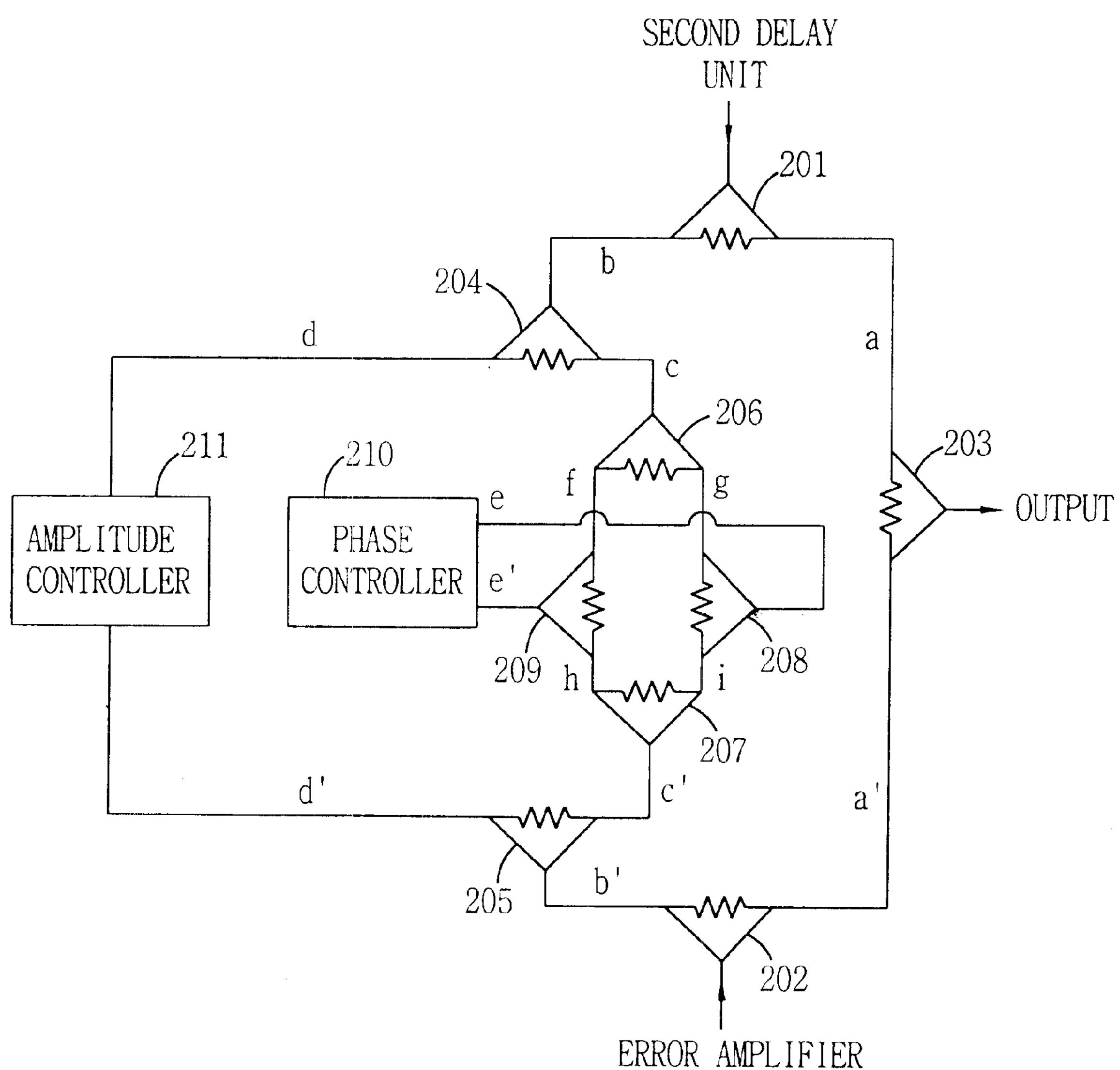
FIG. 5 is a view illustrating a construction of an error cancellation loop circuit in accordance with the present invention.

As shown in FIG. 5, the error cancellation loop circuit 200 has the same construction as that of the carrier cancellation loop circuit 100 except that it receives the output signal of the second delay unit 212 and the output signal of the error amplifier 49.

The operation of the linear power amplifying apparatus constructed as described above in accordance with the second embodiment of the present invention will now be explained.

The operation of amplifying a signal inputted to the linear power amplifying apparatus by the main amplifier 44 and canceling the carrier by the carrier cancellation loop circuit 100 is performed in the same manner as in the first embodiment of the present invention of FIG. 2, descriptions of which is, thus, omitted.

The carrier-cancelled error signal outputted from the carrier cancellation loop circuit 100 is inputted to the second variable attenuator 47. Then, the second variable attenuator 47 attenuates the error signal under the control of the error cancellation loop circuit 200.

The second variable phase shifter 48 shifts the phase of the error signal outputted from the second variable attenuator 47 under the phase-control of the error cancellation loop circuit 200.

The error amplifier 49 amplifies the error signal outputted from the second variable phase shifter 48 to the amplification amplitude of the main amplifier 44. No harmonics are produced in amplification of the error amplifier 49, so that only the error signal is amplified and outputted.

Meanwhile, the second delay unit 50 delays transmission of the amplified signal as distributed by the amplified signal distributor 45 for a predetermined time and outputs it to the error cancellation loop circuit 200.

The error cancellation loop circuit 200 operates in the same manner as that of the carrier cancellation loop circuit 100. That is, the error cancellation loop circuit 200 compares the amplitude and the phase of the amplified signal delayed in the second delay unit 30 and those of the error signal outputted from the error amplifier 29, generates a control signal for correcting the difference of the amplitude and the phase and outputs it to the second variable attenuator 27 and the second variable phase shifter 28, couples the amplified signal delayed in the second delay unit 30 and the error signal outputted from the error amplifier 29 to cancel the error, and outputs only the carrier signal. The operation of the error cancellation loop circuit 200 is omitted.

Thus, in the linear power amplifying apparatus in accordance with another embodiment of the present invention, the allowable phase difference range for canceling the carrier is reduced, so that the carrier can be removed as much as desired and attenuation controlling and phase controlling are facilitated. Likewise, in addition, the allowable phase range for canceling the error is broadened, so that the error is removed as much as desired and the attenuation controlling and phase controlling are facilitated.

As so far described, according to the linear power amplifying apparatus of the present invention, in case where the phases of the signal amplified in the main amplifier and of the input signal are compared, the amplified signal and the input signal are distributed and then coupled with a predetermined phase difference, thereby reducing the error component and widening the tolerance band which can attenuate the carrier as much as desired, so that the phase controlling for carrier attenuation is facilitated.

In addition, in case where the phase of the error signal amplified in the error amplifier and that of the input signal amplified in the main amplifier are compared, the error signal and the input signal are distributed and then coupled with a predetermined phase difference, thereby reducing the error component and widening the tolerance band which can attenuate the error as much as desired, so that the phase controlling for error attenuation is facilitated.

Consequently, as the carrier cancellation and error cancellation are facilitated, the harmonics produced when the main amplifier amplifies the input signal is easily removed.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A linear power amplifying apparatus, comprising:

a carrier cancellation loop circuit for respectively distributing an input signal and an amplified signal of a main amplifier, outputting an amplitude control signal for controlling attenuating of the input signal according to the amplitude difference between the distributed input signal and the distributed amplified signal, coupling the distributed input signal and the distributed amplified signal that are transmitted respectively through transmission lines, and outputting a phase control signal for controlling phase-shifting of the attenuated input signal according to a phase difference between the coupled signals, wherein the carrier cancellation loop circuit comprises a plurality of couplers and a plurality of distributors.

2. The apparatus according to claim 1, wherein the carrier cancellation loop circuit comprises:

a first distributor for distributing the amplified signal from the main amplifier;

a second distributor for distributing the input signal;

a first coupler for coupling a first signal distributed from the first distributor and a first signal distributed from the second distributor, for thereby canceling a carrier component thereof and outputting the resultant signal as an error signal;

a third distributor for distributing a second signal distributed from the first distributor;

a fourth distributor for distributing a second signal distributed from the second distributor;

a fifth distributor for distributing a first signal distributed from the third distributor;

a sixth distributor for distributing a first signal distributed from the fourth distributor;

a second coupler for receiving the first signal distributed from the fifth distributor and the first signal distributed from the sixth distributor and coupling the received signals with a predetermined phase difference therebetween;

a third coupler for receiving the second signal distributed from the fifth distributor and the second signal distributed from the sixth distributor and coupling the received signals with a predetermined phase difference therebetween;

a phase controller for comparing the phase of an output signal of the second coupler and that of an output signal of the third coupler and outputting the phase control signal; and an amplitude controller for comparing the amplitude of the second signal distributed from the third distributor and that of the second signal distributed from the fourth distributor and outputting the amplitude control signal.

3. The apparatus according to claim 2, wherein the length of a transmission line ‘f’ connecting the fifth distributor and the third coupler is not the same as the length of a transmission line ‘h’ connecting the sixth distributor and the third coupler.

4. The apparatus according to claim 3, wherein each of the transmission line 'f' and the transmission line 'h' has a length so that a phase difference between the signal inputted from the fifth distributor to the third coupler and the signal inputted from the sixth distributor to the third coupler is less than 10°.

5. The apparatus according to claim 2, wherein the length of a transmission line 'g' connecting the fifth distributor and the second coupler and the length of a transmission line 'i' connecting the sixth distributor and the second coupler are not the same to each other.

6. The apparatus according to claim 5, wherein each of the transmission line 'g' and the transmission line 'i' has a length so that a phase difference between the signal inputted from the fifth distributor to the second coupler and the signal inputted from the sixth distributor to the second coupler is less than 10°.

7. The apparatus according to claim 2, wherein the length of the transmission line 'g' connecting the fifth distributor and the second coupler are the same as that of the transmission line 'h' connecting the sixth distributor and the third coupler, and the length of the transmission line 'f' connecting the fifth distributor and the third coupler is the same as that of the transmission line 'i' connecting the sixth distributor and the second coupler.

8. The apparatus of claim 1, wherein the carrier cancellation loop circuit couples the distributed input signal and the distributed amplified signal that pass respectively through transmission lines with identical lengths, and generates a carrier cancelled output signal.

9. A linear power amplifying apparatus, comprising:

a carrier cancellation loop circuit for respectively distributing a input signal and an amplified signal of a main amplifier, outputting a first amplitude control signal for controlling attenuating of the input signal according to an amplitude difference between the distributed input signal and the distributed amplified signal, outputting a first phase control signal for controlling phase-shifting of the attenuated input signal according to an phase difference between signals coupled by the distributed input signal and distributed amplified signal; and an error cancellation loop circuit for respectively distributing the amplified signal of the main amplifier and an error signal of an error amplifier, outputting a second amplitude control signal for controlling attenuating of the error signal according to an amplitude difference between the distributed amplified signal and the distributed error signal, outputting a second phase control signal for controlling phase-shifting of the attenuated error signal according to an phase difference between signals coupled by the distributed amplified signal and distributed error signal, wherein the error cancellation loop circuit comprises a plurality of couplets and a plurality of distributors.

10. The apparatus according to claim 9, wherein the carrier cancellation loop circuit comprises:

a first distributor for distributing the amplified signal from the main amplifier;

a second distributor for distributing the input signal;

a first coupler for coupling a first signal distributed from the first distributor and a first signal distributed from the second distributor, for thereby canceling a carrier component thereof and outputting the resultant signals as an error signal;

a third distributor for distributing a second signal distributed from the first distributor;

a fourth distributor for distributing a second signal distributed from the second distributor;

a fifth distributor for distributing a first signal distributed from the third distributor;

a sixth distributor for distributing a first signal distributed from the fourth distributor;

a second coupler for receiving and coupling the first signal distributed from the fifth distributor and the first signal distributed from the sixth distributor with a first predetermined phase difference;

a third coupler for receiving and coupling the second signal distributed from the fifth distributor and the second signal distributed from the sixth distributor with a second predetermined phase difference;

a phase controller for comparing the phase of an output signal of the second coupler and that of an output signal of the third coupler and outputting the first phase control signal to a first variable phase shifter; and an amplitude controller for comparing the amplitude of the second signal distributed from the third distributor and that of the second signal distributed from the fourth distributor and outputting the first amplitude control signal to a first variable attenuator.

11. The apparatus according to claim 10, wherein the length of a transmission line 'f' connecting the fifth distributor and the third coupler is not the same as the length of a transmission line 'h' connecting the sixth distributor and the third coupler.

12. The apparatus according to claim 11, wherein each of the transmission line 'f' and the transmission line 'h' has a length so that a phase difference between the signal inputted from the fifth distributor to the third coupler and the signal inputted from the sixth distributor to the third coupler is less than 10°.

13. The apparatus according to claim 10, wherein the length of a transmission line 'g' connecting the fifth distributor and the second coupler and the length of a transmission line 'i' connecting the sixth distributor and the second coupler are not the same to each other.

14. The apparatus according to claim 13, wherein each of the transmission line 'g' and the transmission line 'i' has a length so that a phase difference between the signal inputted from the, fifth distributor to the second coupler and the signal inputted from the sixth distributor to the second coupler is less than 10°.

15. The apparatus according to claim 10, wherein the length of the transmission line 'g' connecting the fifth distributor and the second coupler are the same as that of the transmission line 'h' connecting the sixth distributor and the third coupler, and the length of the transmission line 'f' connecting the fifth distributor and the third coupler is the same as that of the transmission line 'i' connecting the sixth distributor and the second coupler.

16. The apparatus according to claim 9, wherein the error cancellation loop circuit comprises:

a first distributor for distributing the amplified signal from the main amplifier;

a second distributor for distributing the error signal outputted from the error amplifier;

a first coupler for coupling a first signal distributed from the first distributor and a first signal distributed from the second distributor, canceling an error and generating and outputting a carrier signal;

a third distributor for distributing a second signal distributed from the first distributor;

a fourth distributor for distributing a second signal distributed from the second distributor;

a fifth distributor for distributing a first signal distributed from the third distributor;

a sixth distributor for distributing a first signal distributed from the fourth distributor;

a second coupler for receiving the first signal distributed from the fifth distributor and the first signal distributed from the sixth distributor with a predetermined phase difference and coupling them;

a third coupler for receiving the second signal distributed from the fifth distributor and the second signal distributed from the sixth distributor wxyxyw with a predetermined phase difference and coupling them;

a phase controller for comparing the phase of an output signal of the second coupler and that of an output signal of the third coupler and outputting the second phase control signal to a second variable phase shifter; and an amplitude controller for comparing the amplitude of the second signal distributed from the third distributor and that of the second signal distributed from the fourth distributor and outputting the second amplitude control signal to a second variable attenuator.

17. The apparatus according to claim 16, wherein the length of a transmission line 'f' connecting the fifth distributor and the third coupler is not the same as the length of a transmission line 'h' connecting the sixth distributor and the third coupler.

18. The apparatus according to claim 17, wherein each of the transmission line 'f' and the transmission line 'h' has a length so that a phase difference between the signal inputted from the fifth distributor to the third coupler and the signal inputted from the sixth distributor to the third coupler is less than 10°.

19. The apparatus according to claim 16, wherein the length of a transmission line 'g' connecting the fifth distributor and the second coupler and the length of a transmission line 'i' connecting the sixth distributor and the second coupler are not the same to each other.

20. The apparatus according to claim 19, wherein each of the transmission line 'g' and the transmission line 'i' has a length so that a phase difference between the signal inputted from the fifth distributor to the second coupler and the signal inputted from the sixth distributor to the second coupler is less than 10°.

21. The apparatus according to claim 16, wherein the length of the transmission line 'g' connecting the fifth distributor and the second coupler are the same as that of the transmission line 'h' connecting the sixth distributor and the third coupler, and the length of the transmission line 'f' connecting the fifth distributor and the third coupler is the same as that of the transmission line 'i' connecting the sixth distributor and the second coupler.

22. The apparatus of claim 9, wherein the carrier cancellation loop circuit passes the distributed input signal and the distributed amplified signal respectively through transmission lines with identical lengths, couples the thusly passed signals, and generates a carrier cancelled signal.

23. The apparatus of claim 9, wherein the carrier cancellation loop circuit passes the distributed input signal and the distributed amplified signal through transmission lines with respectively different lengths for thereby widening a cancellation tolerance band of the carrier.

24. The apparatus of claim 9, wherein the error cancellation loop circuit passes the distributed amplified signal and the distributed error signal through transmission lines with respectively identical lengths, couples the thusly passed signals, and generates an error-cancelled output signal.

25. The apparatus of claim 9, wherein the error cancellation loop circuit passes the distributed amplified signal and the distributed error signal through transmission lines with respectively different lengths and outputs the second phase control signal according to the phase difference between the coupled distributed amplified signal and distributed error signal for thereby widening a cancellation tolerance band of the error.

* * * * *